United States Patent
Hung et al.

(10) Patent No.: US 6,757,189 B2
(45) Date of Patent: Jun. 29, 2004

(54) MAGNETIC RANDOM ACCESS MEMORY WITH MEMORY CELLS OF DIFFERENT RESISTANCES CONNECTED IN SERIES AND PARALLEL

(75) Inventors: Chien-Chung Hung, Taipei (TW); Ming-Jer Kao, Tainan (TW); Tsung-Ming Pan, Pingtung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/421,893

(22) Filed: Apr. 24, 2003

(65) Prior Publication Data

US 2004/0047204 A1 Mar. 11, 2004

Related U.S. Application Data

(60) Provisional application No. 60/408,904, filed on Sep. 9, 2002.

(51) Int. Cl.[7] .............................................. G11C 11/15
(52) U.S. Cl. ........................ 365/158; 365/173; 365/171; 365/189.09
(58) Field of Search ................................. 365/158, 173, 365/171, 130, 132, 189.09

(56) References Cited

U.S. PATENT DOCUMENTS

| | | | | |
|---|---|---|---|---|
| 5,734,605 A | * | 3/1998 | Zhu et al. .................... | 365/173 |
| 6,421,271 B1 | * | 7/2002 | Gogl et al. ................... | 365/158 |
| 6,570,783 B1 | * | 5/2003 | Deak ........................... | 365/158 |
| 6,633,497 B2 | * | 10/2003 | Nickel ......................... | 365/158 |
| 6,646,910 B2 | * | 11/2003 | Bloomquist et al. ......... | 365/158 |

* cited by examiner

Primary Examiner—Andrew Q. Tran
(74) Attorney, Agent, or Firm—Troxell Law Office PLLC

(57) ABSTRACT

High density magnetic random access memory (MRAM) is disclosed. In the MRAM, by using the multi-layered magnetic materials with different resistance characteristics, the magnetic tunnel junction (MTJ) cells are connected in parallel or in series, which are connected to a transistor, so as to be a control element for reading data without complicated reading procedure and timing, resulting in high density package of MRAM.

34 Claims, 15 Drawing Sheets

MAGNETIC RANDOM ACCESS MEMORY WITH MEMORY CELLS OF DIFFERENT RESISTANCES CONNECTED IN SERIES AND PARALLEL

This application is a nonprovisional utility application of provisional application No. 60/408,904, filed Sep. 9, 2002.

BACKGROUND OF THE INVENTION

1. Field of the Invention

The present invention relates to a high density magnetic random access memory (MRAM), and more specifically, to an MRAM comprising magnetic tunnel junction (MTJ) cells with different resistance characteristics and a transistor connected in parallel or in series with the MTJ cells, so as to be a control element for reading data without complicated reading procedure and timing, resulting in high density package of magnetic random access memory.

2. Description of the Prior Art

The MRAM has advantages such as non-volatility, high integrity, high access speed and strong radiation resistance. When reading the memory data, a voltage source is provided in a selected MTJ cell, so as to determine the digit value of the data by reading the sensing current. However, when writing the memory data, the conventional method employs two current lines (namely, a bit line and a write word line) to select a MRAM by inducing a magnetic field, so as to change the magnetization orientation of the magnetic material and update the data state.

It is known that the MRAM between the bit line and the write word line is a stacked structure formed of multi-layered magnetic materials. Basically, the MRAM comprises a soft magnetic layer, a nonmagnetic conductor or a tunnel barrier, and a hard magnetic layer. By the magnetization orientations of the two magnetic layers, which are in parallel in the same direction or in opposite directions, the data state is determined to be "1" or "0". In the prior arts, such as U.S. Pat. No. 6,418,046 entitled "MRAM structure and system" filed by Naji and Peter K. (Gilbert, Ariz.) and "A low power 1 Mbit MRAM based on 1T1MTJ bit cell integrated with Copper Interconnects", VLSI 2002 by M. Durlam et al., the MRAMs are composed of a MTJ cell and a transistor. Two adjacent transistors share the same source and isolation region such that the memory cell size formed thereof is 20 $F^2$ (wherein F is the characteristic size of technology node). However, compared with the dynamic random access memory (DRAM), such as an example described in "A Highly Manufacturable 110 nm DRAM Technology with 8 $F^2$ Vertical Transistor Cell for 1 Gb and Beyond", VLSI 2002 by H. Akatzu et al., the size of the MRAM is more than two times of 8 $F^2$ of the DRAM. Besides, compared with the ferroelectric random access memory (FRAM), such as an example described in "Novel Integration Technologies for Highly Manufacturable 32 Mb FRAM", VLSI 2002 by H. H. Kim, et al., the bit size of the FRAM has decreased to 15 $F^2$. Therefore, it is obvious that the MRAM has fallen behind the DRAM and FRAM. Recently, an improved structure for the MRAM has been disclosed in U.S. Pat. No. 6,421,271, in which MTJ cells are connected in parallel to a transistor such that the MRAM is downsized. However, complicated reading process such as back-writing method (commonly used in DRAM) is required for successfully accessing the data state, therefore, it significantly reduces the operation speed and is hard to replace the static random access memory (SRAM).

Please refer to FIG. 1, it shows a schematic diagram of a conventional MRAM comprising an MTJ cell and a transistor according to U.S. Pat. No. 5,734,605. As shown in FIG. 1, the first write word line W1 and the second write word line W2 are perpendicular to and crisscross with the first bit line S1 and the second bit line S2. And a plurality of MTJ cells 11 and transistors 13 are disposed between the write word lines and the bit lines. Each MRAM cell is composed of an MTJ cell 11 and a transistor 13 (i.e. 1T1MTJ structure). Since the transistor includes a source, a drain, a gate, and an isolation, etc., the transistor occupies a large area when desinging the layout. The memory cell area of this kind of structure is about $20F^2$, not comparable with the DRAM. Therefore, it is not competitive.

Please refer to FIG. 2, it shows a schematic diagram of a conventional MRAM with a plurality of MTJ cells and a transistor according to U.S. Pat. No. 6,421,271. As shown in FIG. 2, a plurality of MTJ cells 20 are connected in parallel with each other and also connected to a transistor, therefore, significantly increasing the density. The gate of the first transistor Tr1 connects to the first read word line WL1, and the drain of the first transistor Tr1 connects to a plurality of MTJ cells 20 that are connected in parallel with each other. The gate of the second transistor Tr2 connects to the second read word line WL2, and the drain of the transistor Tr2 also connects to other MTJ cells 20 that are connected in parallel with each other, and use the same bit line BL with those MTJ cells 20 connected to the first transistor Tr1. However, since readout signal of the bit line is the equivalent resistance after the MTJ cells 20 are connected in parallel, it needs an additional readout process to filter the complex signals. The additional readout process requires destructive reading process, resulting in poor endurance of the memory cells and reducing the readout speed.

Accordingly, the present invention provides an MRAM to improve the drawbacks of uncapable of reducing size and increasing readout speed. The invention uses two bits to share one transistor and uses two MTJ cells with different resistance characteristics, which are connected in parallel or in series, so as to increase the package density and the readout speed, and to be a unified memory in replace of the conventional Flash, SRAM, and DRAM.

SUMMARY OF THE INVENTION

Accordingly, the primary object of the present invention is to provide a high density MRAM with reduced size. In the MRAM, by using the multi-layered magnetic materials with different resistance characteristics, the magnetic tunnel junction cells are connected in parallel or in series, which are connected to a transistor, so as to be a control element for reading data. And there is a write word line for providing the magnetic field of the writing operation for a plurality of MTJ cells. Besides, there is a read word line for controlling the readout signal. Further, there is a plurality of bit lines for reading the data. Therefore, the present invention can increase the packing density and provide a unified memory in replace of the conventional Flash, SRAM, and DRAM.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention can be exemplified by the preferred embodiments as described hereinafter.

Figure 1:
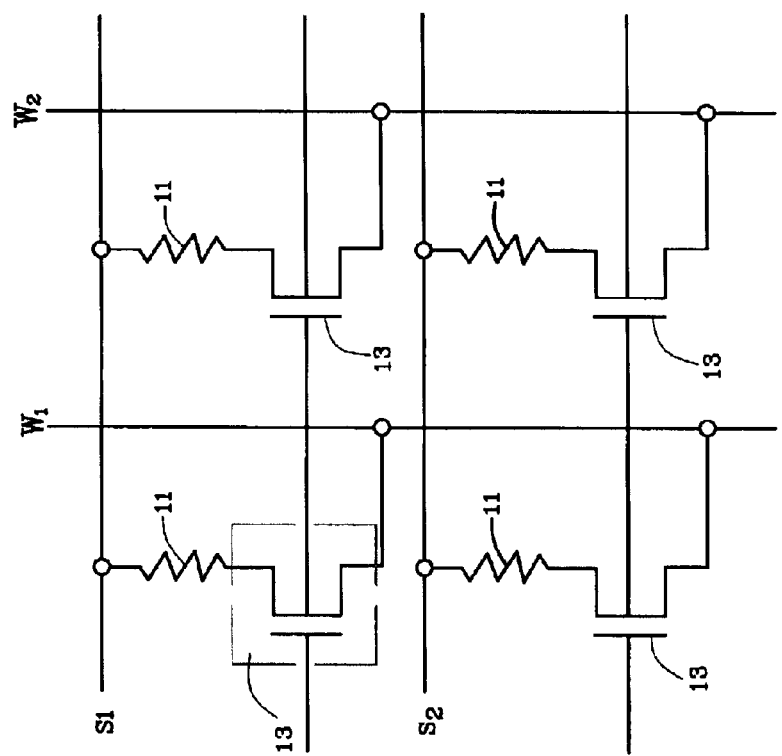
FIG. 1 is a schematic diagram showing a conventional MRAM comprising a MTJ cell and a transistor.
Figure 2:
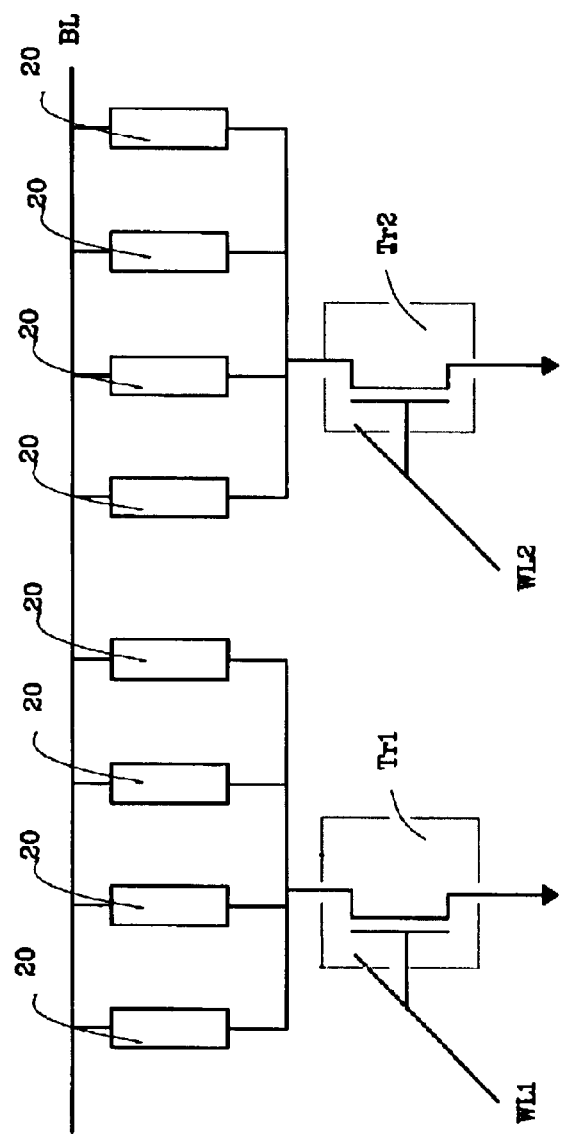
FIG. 2 is a schematic diagram showing a conventional MRAM comprising a plurality of MTJ cells and a transistor.
Figure 3:
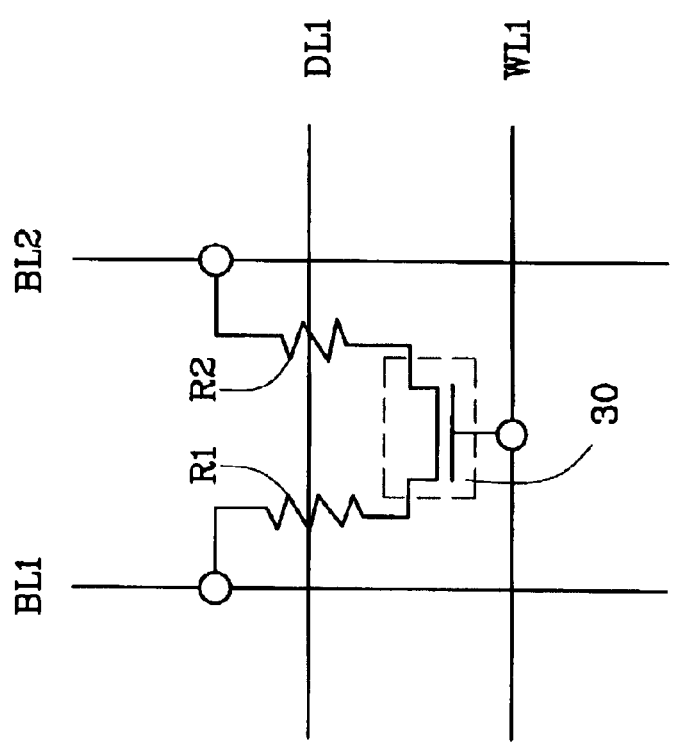
FIG. 3 is a schematic diagram showing a high density MRAM comprising a two-bit memory cell of a series MTJ structure in accordance with the present invention.

Please refer to FIG. 3. FIG. 3 is a schematic diagram showing a high density MRAM comprising a two-bit memory cell of a series MTJ structure in accordance with the present invention. Wherein the first MTJ cell R1 and the second MTJ cell R2 have characteristic curves with different resistances and are connected with each other through a transistor 30. The transistor 30 is used for controlling readout signal through a read word line WL1 at the gate terminal. One terminal of the first MTJ cell R1 is connected to the first bit line BL1 and one terminal of the second MTJ cell R2 is connected to the second bit line BL2. The first write word line DL1 passes the vicinity of the first MTJ cell R1 and the second MTJ cell R2, so as to provide a magnetic field required for writing operation. The two-bit memory cells are magnetic materials of the high density MRAM. By changing the magnetization orientation of the materials, the data state of the two-bit memory cells can be updated, that is, reading or writing data. The above-mentioned transistor 30 is the switch and controlling element of the two-bit memory cells for reading data.

Figure 4:
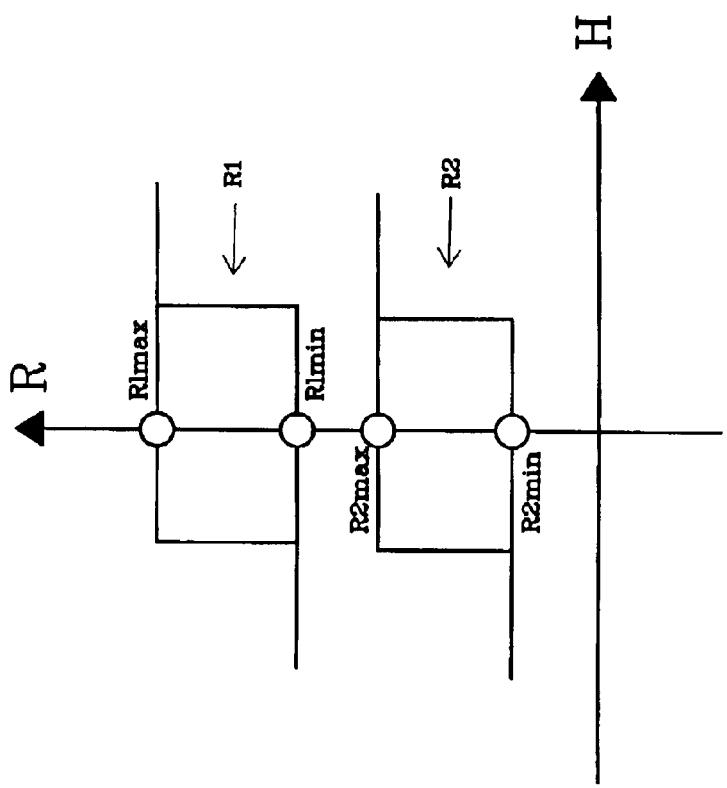
FIG. 4 is a schematic diagram showing a R-H loop in two MTJ cells of the high density MRAM in accordance with the present invention.

FIG. 4 is a schematic diagram showing a R-H loop in two MTJ cells of the high density MRAM in accordance with the present invention. At zero magnetic field, taking the first MTJ cell R1 for example, there are two states for the resistance value, that is, R1max and R1min, indicating that the MTJ cell has non-volatile memory effect. In the present invention, however, two MTJ cells with different resistance characteristics (i.e., R1 and R2) are connected either in series or in parallel. More particularly, there are two states (R1max and R1min) for the first MTJ cell R1 and two states (R2max and R2min) for the second MTJ cell R2.

When the two MTJ cells are connected in series, the overall equivalent resistance would be (R1max+R2max), (R1min+R2max), (R1max+R2min) or (R1min+R2min). That is, there are four states for the overall equivalent resistance when the two MTJ cells are connected in series. Similarly, there are also four states for the overall equivalent resistance when the two MTJ cells are connected in parallel. Therefore, no additional readout process and clock cycle are required when reading out the data.

Following are a few calculations based on the case in which the two MTJ cells are connected in series. Assuming the specific resistance value (RA) of the MTJ cell is 10 K$\Omega$-$\mu m^2$, the area of the first MTJ cell R1 is 0.2592 $\mu m^2$ (0.36×0.72 $\mu m^2$), the area of the second MTJ cell R2 is 0.1568 $\mu m^2$ (0.56×0.28 $\mu m^2$), and the magneto resistance (MR) value of the MTJ cell is 50%, there are four states (154 K$\Omega$, 134 K$\Omega$, 122 K$\Omega$ and 102 K$\Omega$) for the two serial connected MTJ cells. On the other hand, there are also four states (36 K$\Omega$, 30 K$\Omega$, 27 K$\Omega$ and 24 K$\Omega$) for the two parallel connected MTJ cells.

Besides, in the conventional structure, if the resistance value of the first MTJ cell R1 is the same with that of the second MTJ cell R2, the specific resistance value (RA) of the MTJ cell is 10 K$\Omega$-$\mu m^2$, the area is 0.1568 $\mu m^2$ (0.56×0.28 $\mu m^2$), there are three states (48 K$\Omega$, 38 K$\Omega$, and 32 K$\Omega$) for the two parallel connected MTJ cells. Therefore, additional readout process and clock cycle are required to figure out the bit state.

In addition to the connection of the first MTJ cell R1 and the second MTJ cell R2 shown in FIG. 3, this invention further includes the combination of more than the first MTJ cell R1 and the second MTJ cell R2 connection. Another embodiment of this invention is to apply the first MTJ cell R1, the second MTJ cell R2, and the third MTJ cell R3 connected in series or parallel to make the equivalent resistance value divide into eight separated equivalent values. The separated equivalent value employs an appropriate reference generator to distinguish the individual bit state. By using more MTJ cells with serial or parallel connection, a high density and high access speed MRAM can be provided according to this invention.

Figure 5:
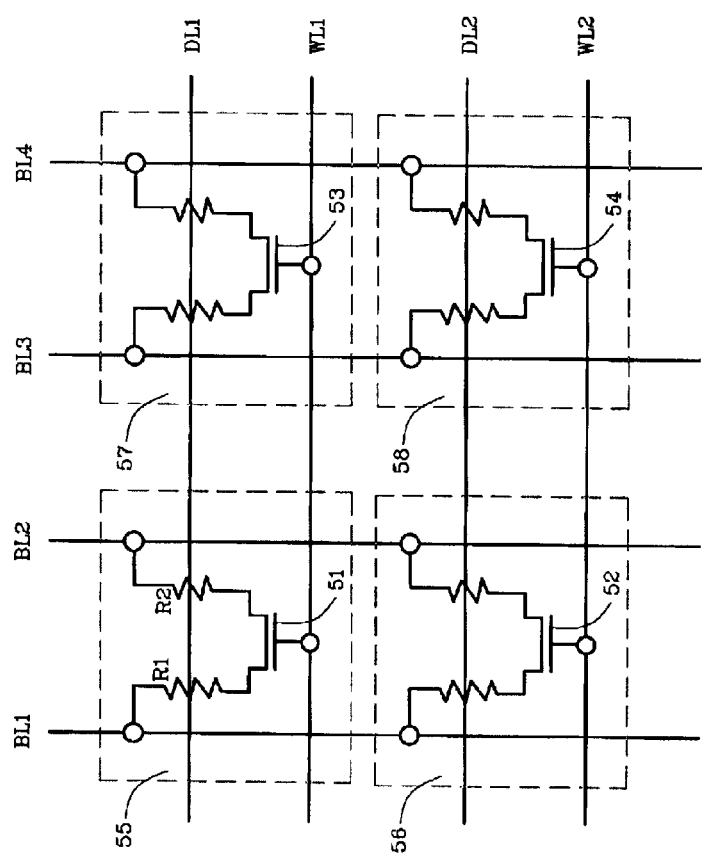
FIG. 5 is a schematic diagram showing a series MTJ structure of the high density MRAM in accordance with the present invention.

Please further refer to FIG. 5, which is a schematic diagram showing a series MTJ structure of the high density MRAM in accordance with the present invention. As shown in FIG. 5, by using a two-bit cell sharing a transistor, the area occupied by each memory cell is reduced. Wherein the first MTJ cell R1 is connected to the first bit line BL1 and the second MTJ cell R2 is connected to the second bit line BL2. Further, the first MTJ cell R1 and the second MTJ cell R2 are connected to a transistor 51. The gate of the transistor 51 is connected to the first read word line WL1 for controlling the readout signal. Another write word line DL1 passes the vicinity of the first MTJ cell R1 and the second MTJ cell R2 so as to provide a magnetic field required for writing operation. The first two-bit memory cell 55 is therefore constructed. Besides, the transistor 52 is connected to the first bit line BL1 and the second bit line BL2 by the MTJ cells. The gate of the transistor 52 is connected to the second read word line WL2. Another write word line DL2 passes the vicinity of the MTJ cells so as to provide a magnetic field required for writing operation. The second two-bit memory cell 56 is therefore constructed. Further, the transistor 53 is connected to a third bit line BL3 and the forth bit line BL4 by the MTJ cells. The gate of the transistor 53 is connected to the first read word line WL1. The write word line DL1 passes the vicinity of the MTJ cells so as to provide a magnetic field required for writing operation. The third two-bit memory cell 57 is therefore constructed. Furthermore, the transistor 54 is connected to the third bit line BL3 and the forth bit line BL4 by the MTJ cells. The gate of the transistor 54 is connected to the second read word line WL2. The write word line DL2 passes the vicinity of the MTJ cells so as to provide a magnetic field required for writing operation. The forth two-bit memory cell 58 is therefore constructed. The first two-bit memory cell 55, the second two-bit memory cell 56, the third two-bit memory cell 57, and the forth two-bit memory cell 58 comprise one embodiment of the series MTJ structure of the present invention.

FIG. 5 shows a 4×2 array of the series MTJ structure according to FIG. 3. In practical cases, the number of the memory cells is not limited to those shown in FIG. 5.

Figure 6:
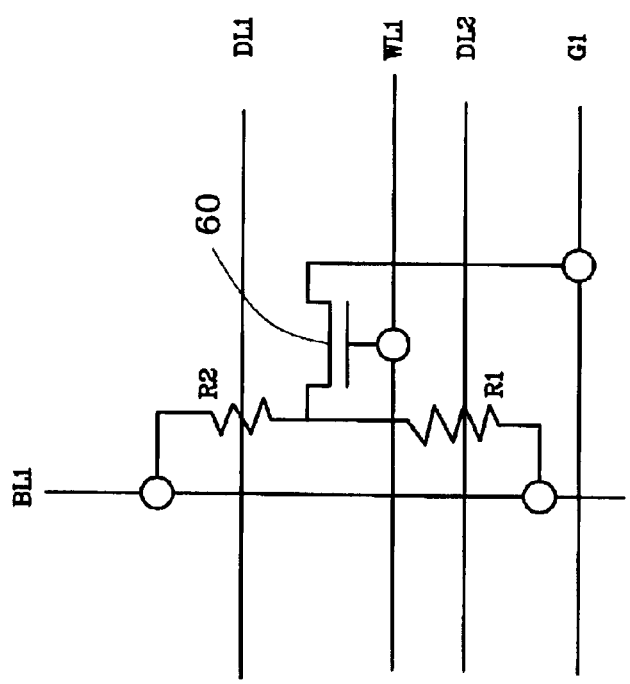
FIG. 6 is a schematic diagram showing a two-bit memory cell of a parallel MTJ structure in accordance with the present invention.

Please refer to FIG. 6, which is a schematic diagram showing a two-bit memory cell of a parallel MTJ structure in accordance with the present invention. As shown in FIG. 6, the first MTJ cell R1 and the second MTJ cell R2 have characteristic curves with different resistance characteristics and are connected in parallel to a transistor 60. The transistor 60 is used for controlling the readout signal through the first read word line WL1 at the gate terminal. One terminal of the transistor 60 is connected to the first MTJ cell R1 and the second MTJ cell R2, which are connected in parallel. While another terminal of the transistor 60 is grounded G1. One terminal of the first MTJ cell R1 is connected to the first bit line BL1 and one terminal of the second MTJ cell R2 is also connected to the same bit line BL1. The write word line DL2 passes the vicinity of the first MTJ cell R1 so as to provide a magnetic field required for writing operation. Another write word line DL1 passes the vicinity of the second MTJ cell R1 so as to provide a magnetic field required for writing operation.

Figure 7:
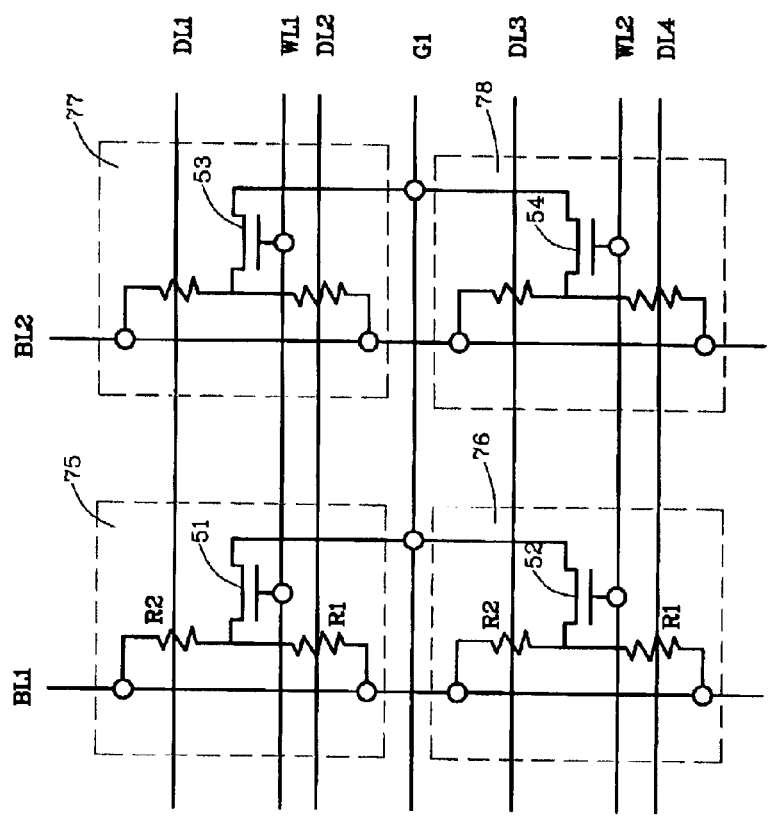
FIG. 7 is a schematic diagram showing a parallel MTJ structure of the high density MRAM in accordance with the present invention.

Please further refer to FIG. 7, which is a schematic diagram showing a parallel MTJ structure of the high density MRAM in accordance with the present invention. As shown in FIG. 7, one terminal of the first MTJ cell R1 and one terminal of the second MTJ cell R2 are commonly connected to a transistor 51. The other terminal of the first MTJ cell R1 and the other terminal of the second MTJ cell R2 are commonly connected to the first bit line BL1. There are first write word line DL1 and second write word line DL2 pass the vicinity of the second MTJ cell R2 and the first MTJ cell R1 respectively, so as to provide a magnetic field required for writing operation. And one terminal of the first transistor 51 is connected to the first read word line WL1, thereby the first two-bit memory cell 75 is constructed. Besides, another terminal of the first transistor 51 is connected to the transistor 52. The transistor 52 is connected to the first bit line BL1 by the parallel connected MTJ cells. The third write word line DL3 and the forth write word line pass the vicinity of the MTJ cells, so as to provide a magnetic field required for writing operation. The gate of the second transistor 52 is connected to the second read word line WL2, thereby the second two-bit memory cell 76 is constructed. Further, one terminal of the transistor 53 is connected to the second bit line BL2 by the parallel connected MTJ cells. The gate of the transistor 53 is connected to the first read word line WL1. The first write word line DL1 and the second write word line DL2 pass the vicinity of the MTJ cells, so as to provide a magnetic field required for writing operation, a third two-bit memory cell 77 is therefore constructed. Furthermore, one terminal of the transistor 53 is connected to the forth transistor 54. One terminal of the forth transistor 54 is connected to the second bit line BL2 by the parallel connected MTJ cells. The gate of the transistor 54 is connected to the second read word line WL2. The third write word line DL3 and the forth write word line DL4 pass the vicinity of the MTJ cells, so as to provide a magnetic field required for writing operation, the forth two-bit memory cell 78 is therefore constructed. The above-mentioned read word lines are used for controlling the readout signal from the MTJ cells. The write word lines are used for providing one part of the magnetic field required for writing operation. The bit lines are readout lines and used for providing another part of the magnetic field required for writing operation. The first two-bit memory cell 75, the second two-bit memory cell 76, the third two-bit memory cell 77, and the forth two-bit memory cell 78 comprise one embodiment of the parallel MTJ structure of the present invention.

FIG. 7 shows a 2×4 array of the parallel MTJ structure according to FIG. 6. In practical cases, more memory cells can be employed to form an MRAM.

Figure 8:
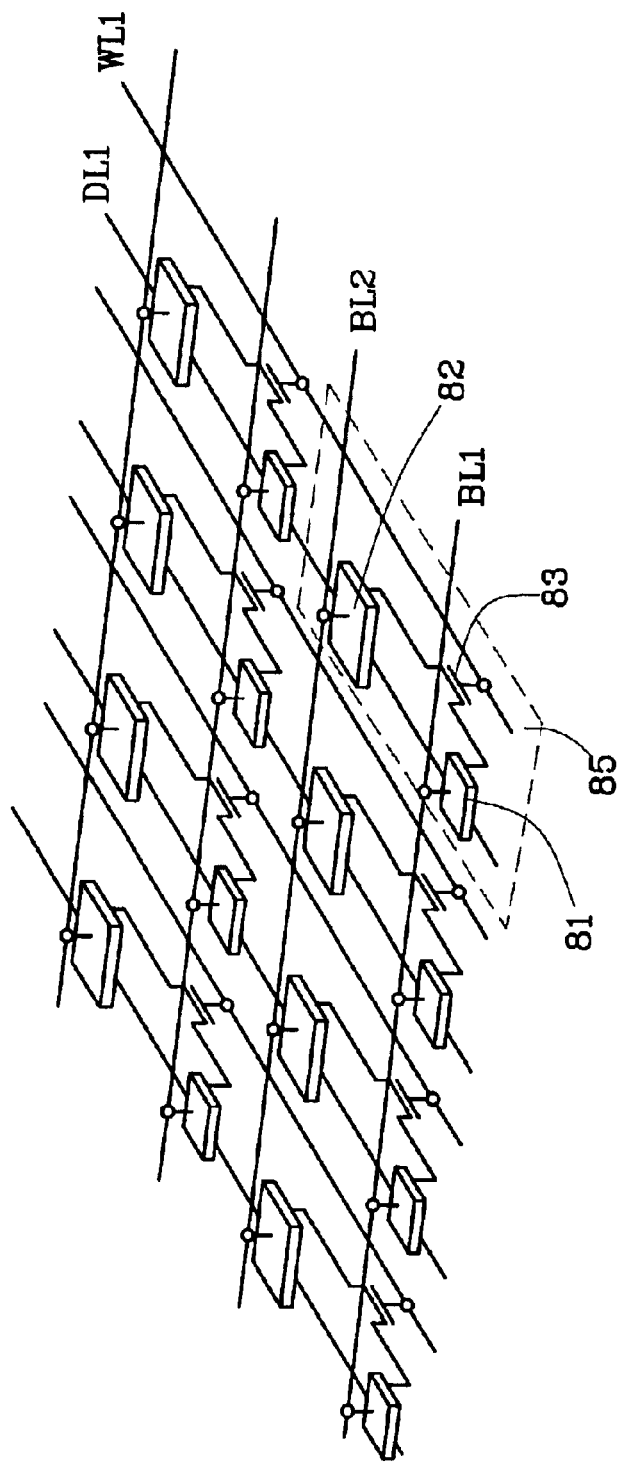
FIG. 8 is a 3-D schematic diagram showing a 4×4 array of a series MTJ structure of the high density MRAM in accordance with the present invention.

Please refer to FIG. 8. FIG. 8 is a 3-D schematic diagram showing a 4×4 array of a series MTJ structure of the high density MRAM in accordance with the present invention. By designing a plurality of different sizes of series MTJ cells, a plurality of different resistances between the MTJ cells are achieved.

As shown in FIG. 8, the first MTJ cell 81 and the second MTJ cell 82 with different sizes are connected in series with two terminals of the transistor 83, while another terminal of the transistor 83 is connected to the first read word line WL1. One terminal of the MTJ cell 81 is connected to the first bit line BL1, one terminal of the MTJ cell 82 is connected to the second bit line BL2. The first write word line DL1 passes the vicinity of the two MTJ cells for providing a part of magnetic field for writing operation. The above-mentioned first MTJ cell 81, second MTJ cell 82, transistor 83, first bit line BL1, second bit line BL2, first read word line WL1 and first write word line DL1 comprise a two-bit memory cell 85. Also, FIG. 8 shows the array of a plurality of the memory cells 85. As shown in FIG. 8, a plurality of MTJ cells with different sizes, a plurality of transistors, a plurality of write word lines, a plurality of read word lines and a plurality of bit lines achieve the high density MRAM.

Figure 9:
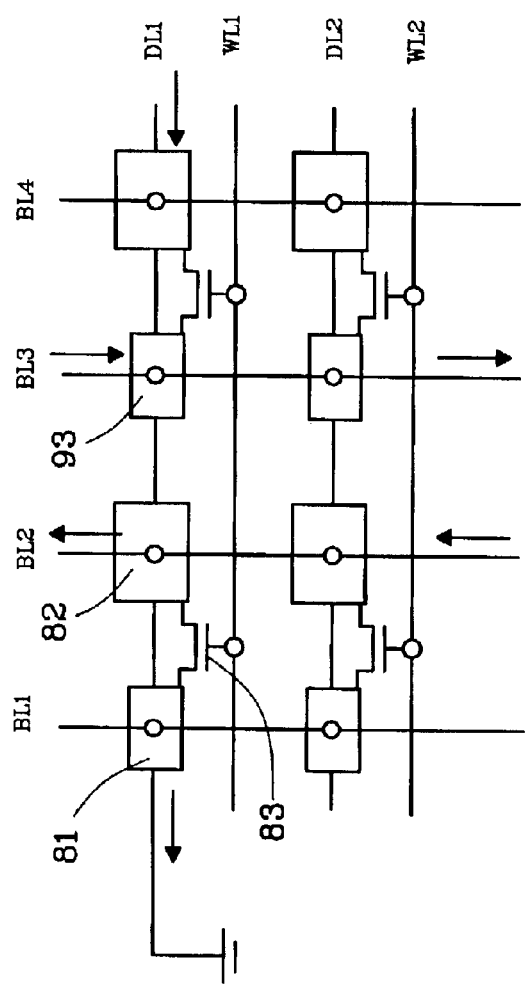
FIG. 9 is a schematic diagram showing the writing operation of a series MTJ structure of the high density MRAM in accordance with the present invention.

FIG. 9 shows the writing operation of a series MTJ structure. The MTJ cells are isolated when the transistor is turned off. The writing operation is performed by cross selection.

When writing data "1", the current on the first write word line DL1 flows from right to left so as to generate a magnetic field on the hard axis of the MTJ cell, while the current on the second bit line BL2 flows upwards from bottom to top so as to generate a magnetic field along the first direction on the easy axis of the MTJ cells. Data is written into the MTJ cell 82 only when two current paths crisscross on the MTJ cell 82. However, in practical cases, the current flow direction is not limited to the above-mentioned directions.

On the other hand, when writing data "0", the current on the first write word line DL1 flows from right to left so as to generate a magnetic field on the hard axis of the MTJ cells, while the current on the third bit line BL3 flows downwards from top to bottom so as to generate a magnetic field along the second direction on the easy axis of the MTJ cells. The MTJ cell 93 on which two current paths crisscrossed is written with data "0". Similar to the conventional 1T1MTJ structure, the writing operation of the MTJ cells as shown in FIG. 9 is performed by a bit line and a write word line crisscrossed on a MTJ cell so as to update the data.

Figure 10:
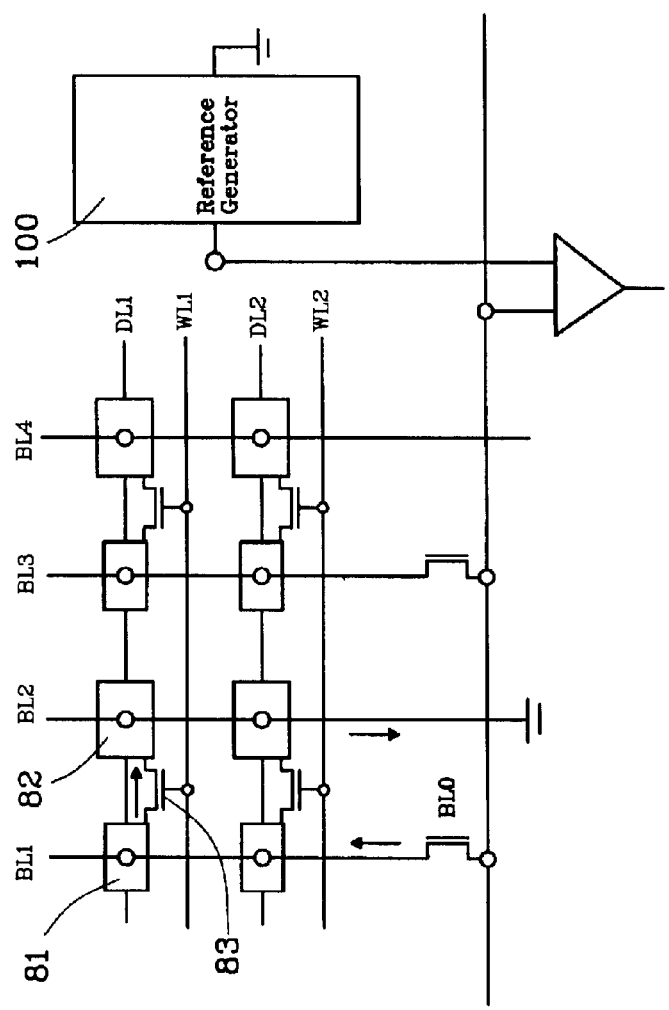
FIG. 10 is a schematic diagram showing the reading operation of a series MTJ structure of the high density MRAM in accordance with the present invention.

Please also refer to FIG. 10, which shows the reading operation of a series MTJ structure. As shown in FIG. 10, the transistor 83 is turned on by the read word line WL1. A voltage current is provided from the first bit line BL1, and the second bit line BL2 is grounded. The sense current flows through the left MTJ 81, the transistor 83 and the right MTJ 82, and the ground terminal. The reading process is performed by comparing the sense current with a reference current generated by a reference generator 100. Therefore, the MRAM can read the two-bit data simultaneously without complicated reading clock or timing to distinguish individual bit data. A high density with high reading throughput MRAM can be achieved.

Figure 11:
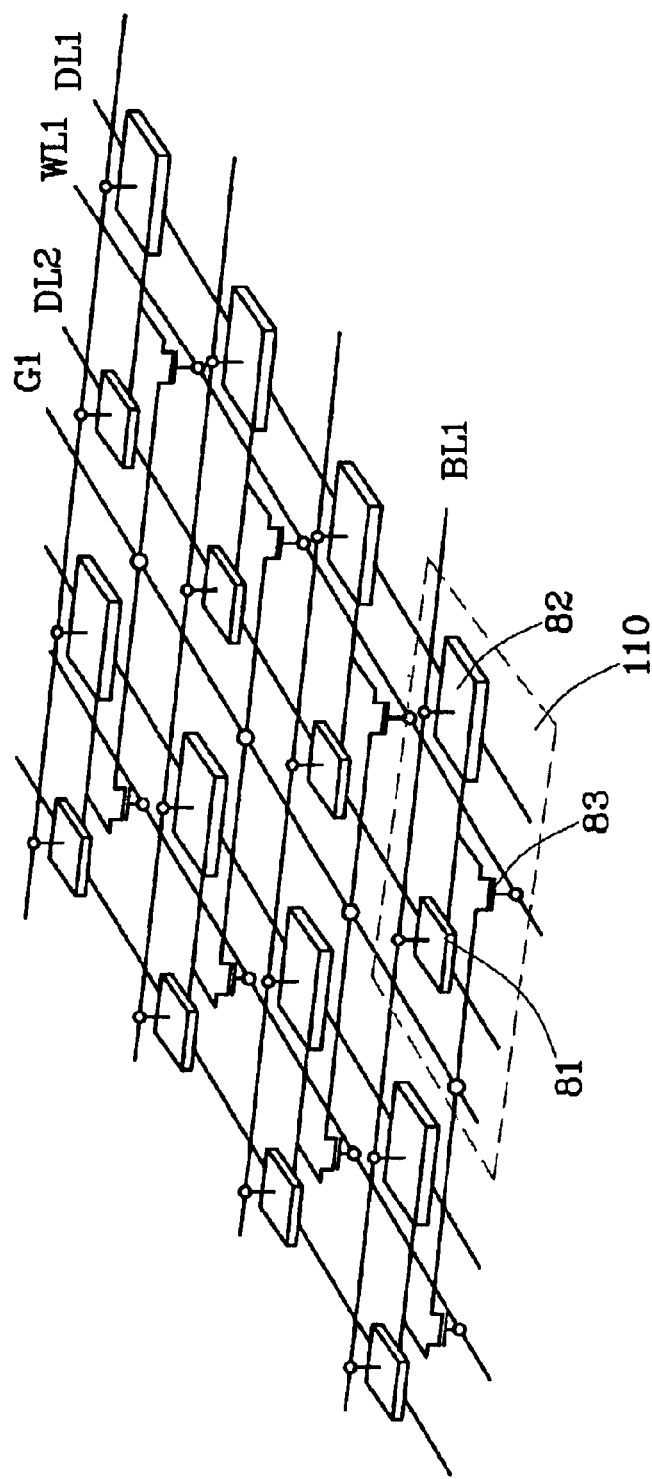
FIG. 11 is a 3-D schematic diagram showing a 4×4 array of a parallel MTJ structure of the high density MRAM in accordance with the present invention.

FIG. 11 is a 3D schematic diagram showing a 4×4 array of a parallel MTJ structure of the high density MRAM in accordance with the present invention. By designing two different sizes of parallel MTJ structure, two different resistances are achieved, that is, different R-H loops in two MTJ cells of FIG. 4 can be achieved. As shown in FIG. 11, the MTJ cell 81 and MTJ cell 82 are connected in parallel to one terminal of a transistor 83, while another terminal of the transistor 83 is grounded (G1). Ground G1 is also the ground of each MTJ cell. The gate of the transistor 83 is used for controlling the readout signal through the first read word line WL1. One terminal of the MTJ cell 81 and one terminal of the MTJ cell 82 are connected to the first bit line BL1. Beside, the first write word line DL1 passes the vicinity of MTJ cell 82, so as to provide a magnetic field required for writing operation. Further, the second write word line DL2 passes the vicinity of MTJ cell 81, so as to provide a magnetic field required for writing operation. Therefore, the MTJ cell 81, MTJ cell 82, transistor 83, each bit line, write line, ground connected thereof comprise a pair of memory cell 110 and the array of a plurality of memory cells comprises the embodiment of parallel MTJ structure of the high density MRAM according to the present invention.

Figure 12:
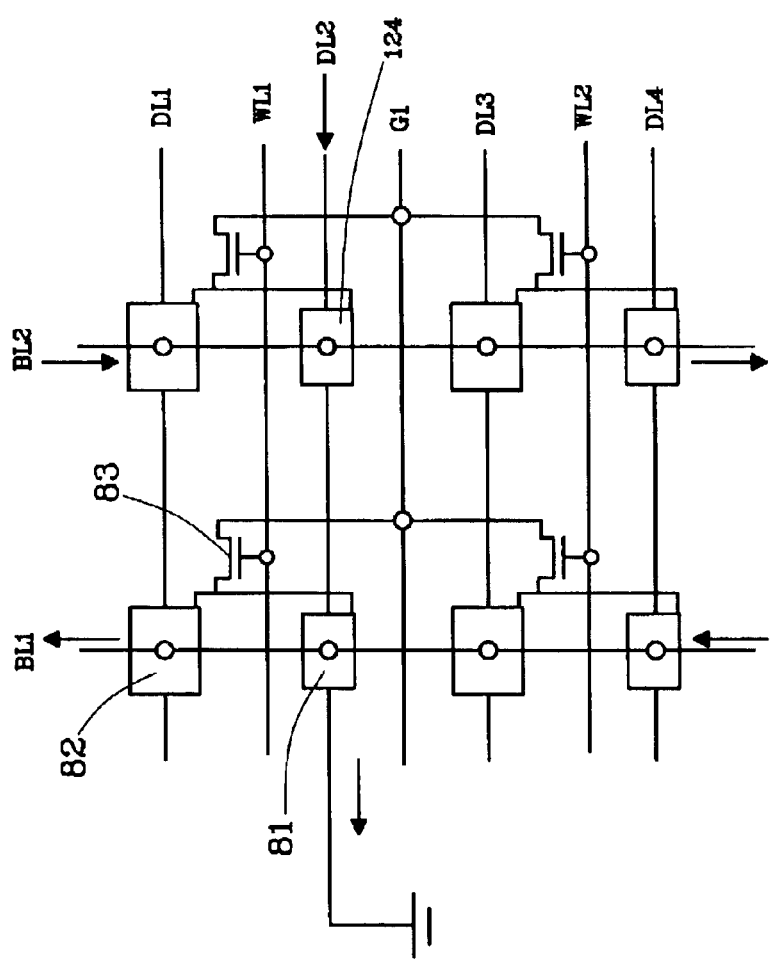
FIG. 12 is a schematic diagram showing the writing operation of a parallel MTJ structure of the high density MRAM in accordance with the present invention.

FIG. 12 is a schematic diagram showing the writing operation of a parallel MTJ structure of the high density MRAM in accordance with the present invention. FIG. 12 shows the writing operation of a parallel MTJ structure with all transistors turned off. The writing operation is performed by cross selection.

When writing data "1", the current on the second write word line DL2 flows from right to left so as to generate a magnetic field on the hard axis of the MTJ cell, while the current on the first bit line BL1 flows upwards from bottom to top, so as to generate a magnetic field along the first direction on the easy axis of the MTJ cell. Data is written into the MTJ cell 81 only when two current paths crisscross on the MTJ cell 81.

However, when writing data "0", the current on the second write word line DL2 flows from right to left so as to generate a magnetic field on the hard axis of the MTJ cell, while the current on the second bit line BL2 flows downwards from top to bottom, so as to generate a magnetic field along the second direction on the easy axis of the MTJ cell. The MTJ cell 124 on which two current paths crisscross is written with data "0". Similar to the conventional 1T1MTJ structure, the writing operation of the MTJ cell is performed by a bit line and a write word line crisscrossed on a MTJ cell so as to update the data. However, in practical cases, the current path directions are not limited to the above-mentioned directions.

Figure 13:
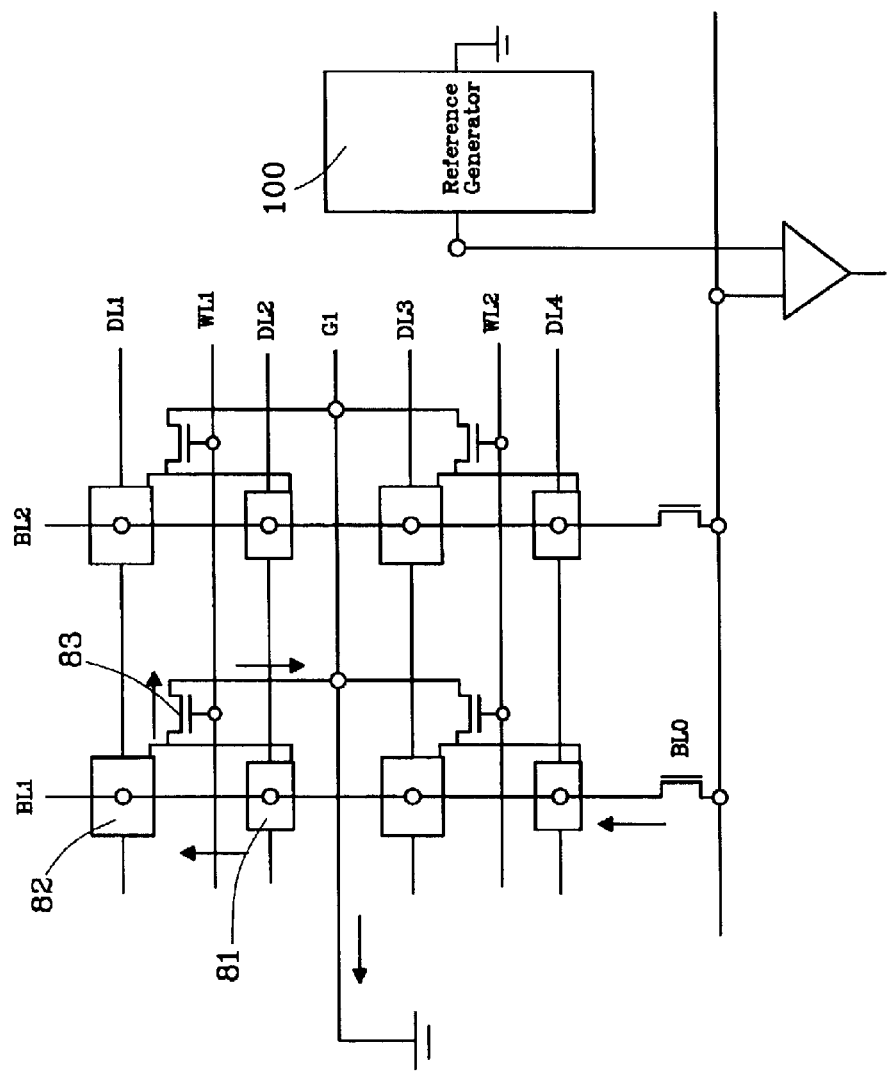
FIG. 13 is a schematic diagram showing the reading operation of a parallel MTJ structure of the high density MRAM in accordance with the present invention.

Please refer to FIG. 13, which shows the reading operation of a parallel MTJ structure. In FIG. 13, taking the two MTJ cells on the top-left corner for example, the transistor 83 is turned on by the first read word line WL1. A voltage source is provided from the first bit line BL1. The sense current flows through the two parallel connected MTJ cells (81 and 82), the turned-on transistor 83 and the ground (G1). The reading process is performed by comparing the sense current with the reference current generated by a reference generator 100. Therefore, the MRAM can read the two-bit data simultaneously without complicated reading clock or timing to distinguish individual bit data.

As the above-mentioned high density MRAM, the memory cells are a plurality of MTJ cells with different size and interlaced arrangement. The MTJ cells include those disposed on the write word lines and bit lines. Another different embodiment of the present invention will be described in the following.

Figure 14:
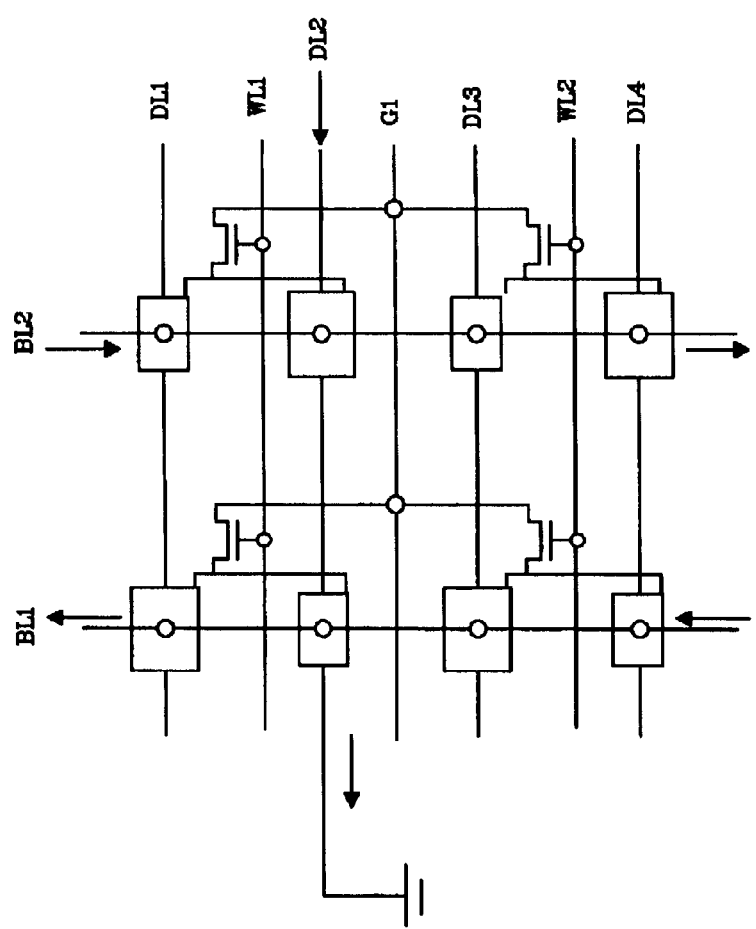
FIG. 14 is a schematic diagram showing the writing operation of the second parallel MTJ structure of the high density MRAM in accordance with the present invention.

FIG. 14 is a schematic diagram showing the writing operation of the second parallel MTJ structure of the high density MRAM in accordance with the present invention. In FIG. 12, the MTJ cells, in which the currents on each write word line flow through, are the same size. However, in FIG. 14, along the path direction of the first write word line DL1, the second write word line DL2, the third write word line DL3 and the forth write word line DL4, the MTJ cells disposed thereof are not the same size. Besides, when writing data, the first read word line WL1 and the second read word line WL2 are turned off, that is, each transistor is turned off.

Figure 15:
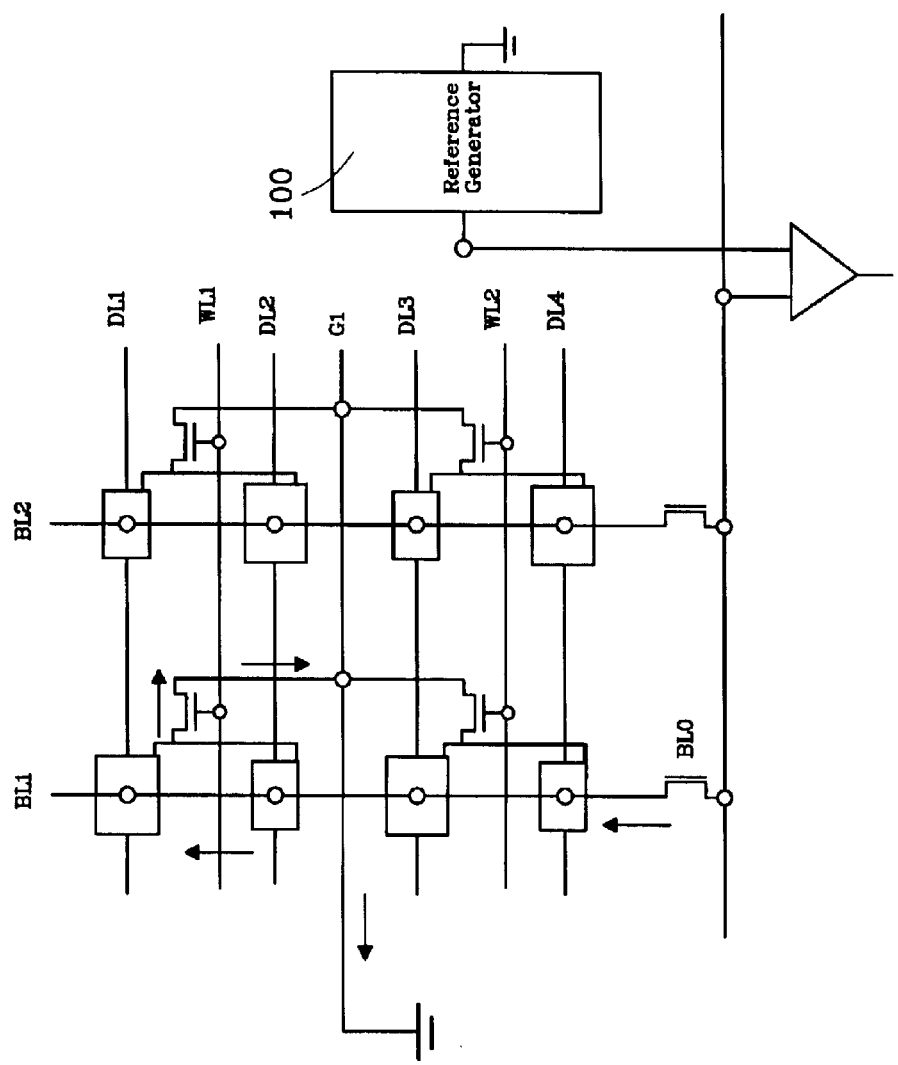
FIG. 15 is a schematic diagram showing the reading operation of the second MTJ structure of the high density MRAM in accordance with the present invention.

FIG. 15 is a schematic diagram showing the reading operation of a parallel MTJ structure of the high density MRAM in accordance with the present invention, so as to change the arrangement sequence of the MTJ cells in FIG. 13. In FIG. 13, the MTJ cells, in which the currents on each write word line flows through, are the same size. However, in FIG. 15, along the path direction of the first write word line DL1, the second write word line DL2, the third write word line DL3 and the forth write word line DL4, the MTJ cells disposed thereof are not the same size. Besides, when reading the two MTJ cells on the top-left corner, the first read word line WL1 is turned on, that is, each transistor connected to WL1 is turned on.

As the above-mentioned, the invention uses two MTJ cells with different area and different resistance characteristics, which are connected in parallel or in series. On the other hand, by using the same area with different manufacturing process, MTJ cells with different resistance characteristics can be connected in parallel or in series. By using the above-mentioned method, there will be four states or more of the equivalent resistance value. Since no additional complicated readout process and timing are required, the present invention increases the package density and does not decrease the readout speed, and will be a unified memory in replace of the conventional Flash, SRAM, and DRAM.

Accordingly, it should be evident to those skilled in the art that minor variations may be in the disclosed embodiments without departing from the spirit and scope of the invention.

What is claimed is:

1. A high density magnetic random access memory (MRAM) composed of a plurality of memory cells, each memory cell comprising:

a plurality of magnetic memory units with different resistance characteristics, generating separated equivalent resistances, and connecting in series, wherein the data state of the magnetic memory unit is updated by changing the magnetization direction of the magnetic material in the MRAM;

a transistor connected to one terminal of the magnetic memory units, which is used as a switch and a controlling element of the memory cell;

a write word line passing the vicinity of the magnetic memory units and providing a magnetic field for the writing operation of the magnetic memory unit;

a plurality of bit lines connected to the other terminal of the magnetic memory units, which is the path for reading operation of the memory cell and providing a magnetic field for the writing operation of the magnetic memory unit; and a read word line for controlling the readout signals of the memory cell.

2. The high density MRAM as claimed in claim 1, wherein the magnetic memory units are connected in series to two terminals of the transistor.

3. The high density MRAM as claimed in claim 1, wherein one terminal of the transistor is connected to the read word line.

4. The high density MRAM as claimed in claim 1, wherein the magnetic memory units are magnetic material with different size and resulting in different resistance characteristics.

5. The high density MRAM as claimed in claim 1, wherein the magnetic memory units are magnetic material with different manufacturing process and resulting in different resistance characteristics.

6. The high density MRAM as claimed in claim 1, wherein the bit line is not parallel with the write word line.

7. The high density MRAM as claimed in claim 1, wherein when the read word line is turned off, the transistor would be turned off, that is, the magnetic memory units are individually in a separated writing state.

8. The high density MRAM as claimed in claim 1, wherein the magnetic memory unit which the bit line and the write word line crisscrossed is written data.

9. The high density MRAM as claimed in claim 1, wherein when the read word line is turned on, the transistor would be turned on, that is, the memory cell is in a reading state.

10. The high density MRAM as claimed in claim 9, wherein the data state of a plurality of bits of the memory cell is read by a reference generator.

11. A high density magnetic random access memory (MRAM) composed of a plurality of memory cells, each memory cell comprising:

a plurality of magnetic memory units with different resistance characteristics, generating separated equivalent resistances, and connecting in parallel, wherein the data state of the magnetic memory unit is updated by changing the magnetization direction of the magnetic material in the MRAM;

a transistor connected to one terminal of the magnetic memory units, which is used as a switch and a controlling element of the memory cell;

a plurality of write word lines passing the vicinity of the magnetic memory units and providing a magnetic field for the writing operation of the magnetic memory unit;

a bit line connected to the other terminal of the magnetic memory units, which is the path for reading operation of the memory cell and providing a magnetic field for the writing operation of the magnetic memory unit; and a read word line for controlling the readout signals of the memory cell.

12. The high density MRAM as claimed in claim 11, wherein the magnetic memory units are connected in parallel and connected to one terminal of the transistor.

13. The high density MRAM as claimed in claim 11, wherein one terminal of the transistor is connected to a ground potential.

14. The high density MRAM as claimed in claim 11, wherein one terminal of the transistor is connected to the read word line.

15. The high density MRAM as claimed in claim 11, wherein the magnetic memory units are magnetic material with different size and resulting in different resistance characteristics.

16. The high density MRAM as claimed in claim 11, wherein the magnetic memory units are magnetic material with different manufacturing process and resulting in different resistance characteristics.

17. The high density MRAM as claimed in claim 11, wherein the bit line is not parallel with the write word line.

18. The high density MRAM as claimed in claim 11, wherein when the read word line is turned off, the transistor would be turned off, that is, the magnetic memory units are individually in a separated writing state.

19. The high density MRAM as claimed in claim 11, wherein the magnetic memory unit which the bit line and the write word line crisscrossed is written data.

20. The high density MRAM as claimed in claim 11, wherein when the read word line is turned on, the transistor would be turned on, that is, the memory cell is in a reading state.

21. The high density MRAM as claimed in claim 20, wherein the data state of a plurality of bits of the memory cell is read by a reference generator.

22. A high density magnetic random access memory (MRAM) composed of a plurality of memory cells, the MRAM comprising:

a plurality of magnetic memory units with different sizes and resulting in different resistance characteristics, generating separated equivalent resistances, and connecting in parallel, wherein the data state of the magnetic memory units is updated by changing the magnetization direction of the magnetic material in the MRAM;

a plurality of transistors connected to one terminal of the magnetic memory units, which are used as switches and controlling elements of the memory cells;

a plurality of write word lines passing the vicinity of the magnetic memory units and providing a magnetic field for the writing operation of the magnetic memory units;

a plurality of bit lines connected to the other terminal of the magnetic memory units, which are the paths for reading operation of the memory cells and providing a magnetic field for the writing operation of the magnetic memory units; and a plurality of read word lines for controlling the readout signals of the memory cells.

23. The high density MRAM as claimed in claim 22, wherein the magnetic memory units are connected in parallel and connected to one terminal of the transistors.

24. The high density MRAM as claimed in claim 22, wherein one terminal of the transistor is connected to a ground potential.

25. The high density MRAM as claimed in claim 22, wherein one terminal of the transistor is connected to the read word line.

26. The high density MRAM as claimed in claim 22, wherein the magnetic memory units are magnetic material with different size and resulting in different resistance characteristics.

27. The high density MRAM as claimed in claim 22, wherein the bit lines are not parallel with the write word lines.

28. The high density MRAM as claimed in claim 22, wherein when the read word lines are turned off, the transistors would be turned off, that is, the magnetic memory units are individually in a separated writing state.

29. The high density MRAM as claimed in claim 22, wherein the magnetic memory units which the bit lines and the write word lines crisscrossed are written data.

30. The high density MRAM as claimed in claim 22, wherein when the read word lines are turned on, the transistors would be turned on, that is, the memory cells are in a reading state.

31. The high density MRAM as claimed in claim 30, wherein the data states of a plurality of bits of the memory cells are read by a reference generator.

32. The high density MRAM as claimed in claim 22, wherein the magnetic memory cells, which are composed of magnetic memory units with different size, are arranged by interlaced sequence.

33. The high density MRAM as claimed in claim 32, wherein the sizes of the magnetic memory units on the bit lines are different.

34. The high density MRAM as claimed in claim 32, wherein the sizes of the magnetic memory units on the write word lines are different.

* * * * *